(12) United States Patent
Hook et al.

(10) Patent No.: US 7,939,894 B2
(45) Date of Patent: May 10, 2011

(54) ISOLATED HIGH PERFORMANCE FET WITH A CONTROLLABLE BODY RESISTANCE

(75) Inventors: Terence B. Hook, Jericho, VT (US); Jenny Hu, Cupertino, CA (US); Jae-Eun Park, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 107 days.

(21) Appl. No.: 12/185,368

(22) Filed: Aug. 4, 2008

(65) Prior Publication Data

US 2010/0025769 A1 Feb. 4, 2010

(51) Int. Cl.
*H01L 21/70* (2006.01)
(52) U.S. Cl. .................... 257/369; 257/E27.016
(58) Field of Classification Search ............ 257/369, 257/E27.016
See application file for complete search history.

(56) References Cited

U.S. PATENT DOCUMENTS 5,760,447 A * 6/1998 Tsuboi ........................ 257/359
6,643,111 B1 * 11/2003 Motz et al. .................. 361/91.1
2003/0062593 A1 * 4/2003 Lakshmikumar ............ 257/529

OTHER PUBLICATIONS

Baker, Thomas and Boland, Bernie, "A Planar Polysilicon Resistor Process for ICs." vol. 19, Motorola, Inc. 1993.

* cited by examiner

*Primary Examiner* — Evan Pert
*Assistant Examiner* — Matthew Reames
(74) *Attorney, Agent, or Firm* — Scully, Scott, Murphy & Presser, P.C.; Joseph P. Abate, Esq.

(57) ABSTRACT

The present invention provides a method of controlling bias in an electrical device including providing semiconductor devices on a bulk semiconductor substrate each including an active body region that is isolated from the active body region of adjacent devices, and providing a body resistor in electrical contact with the active body region of the bulk semiconductor substrate, wherein the body resistor provides for adjustability of the body potential of the semiconductor devices. In another aspect the present invention provides a semiconductor device including a bulk semiconductor substrate, at least one field effect transistor formed on the bulk semiconductor substrate including an isolated active body region, and a resistor in electrical communication with the isolated active body region.

7 Claims, 3 Drawing Sheets

ISOLATED HIGH PERFORMANCE FET WITH A CONTROLLABLE BODY RESISTANCE

FIELD OF THE INVENTION

The present invention relates to semiconducting devices and methods of forming semiconducting devices. More particularly, the present invention relates to semiconducting devices having a resistor that is in electrical communication with the body of the device.

BACKGROUND OF THE INVENTION

Currently, increases in the switching speed of logic circuits is largely dictated by enhancements through device scaling for high drive currents, and low-k dielectrics, i.e., dielectrics having a dielectric constant of 4.0 or less, for reduced parasitic capacitance. With advancements in scaling reaching their technical limits, new approaches are desired to increase device performance.

One approach that has been utilized to increase the metal oxide semiconductor field effect transistor (MOSFET) device current has been through the use of semiconductor on insulator (SOI) technology, which allows for a higher drive current through mechanisms, such as the floating body effect, reduced parasitic capacitance, and device isolation. One disadvantage on the above approach is the cost of SOI substrates. Additionally, MOSFETs formed on SOI substrates present a strong history effect that can result in a delay between the first switch and the second switch.

SUMMARY OF THE INVENTION

In one aspect, the present invention provides a method of controlling bias in semiconductor devices. Broadly, the method of controlling bias includes:
providing a plurality of semiconductor devices on a bulk semiconductor substrate, wherein each of the semiconductor devices comprises an active body region that is isolated from the active body region of adjacent semiconductor devices; and
providing a body resistor in electrical communication with the active body region of the bulk semiconductor substrate, wherein the body resistor provides for adjustability of a body potential of the plurality of semiconductor devices.

In another aspect of the present invention, a semiconductor device is provided that may be used in conjunction with the above-described method. Broadly, the semiconductor device includes:
a bulk semiconductor substrate;
at least one field effect transistor formed on the bulk semiconductor substrate, the field effect transistor comprising an isolated active body region; and
a body resistor in electrical communication with the isolated active body region.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION OF THE INVENTION

Figure 1A:
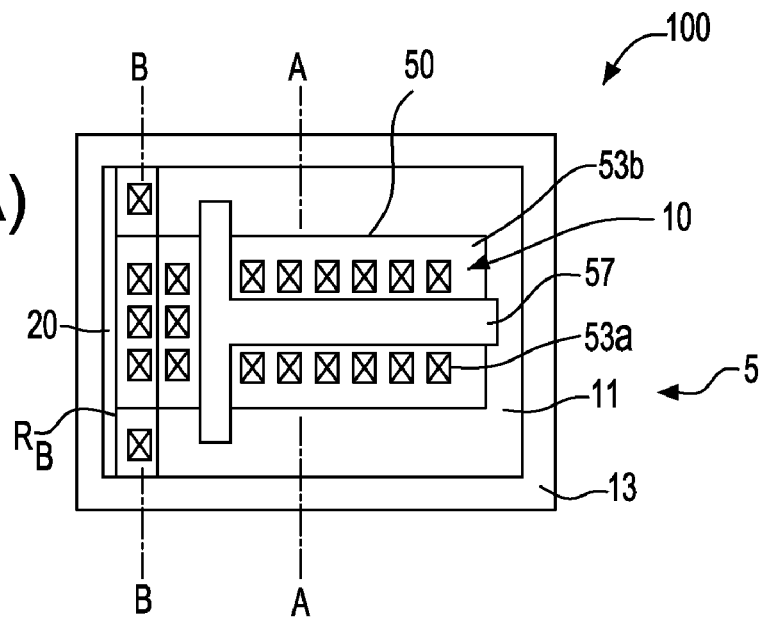
FIG. 1(a) is a top planar view of one embodiment of a semiconductor device including a resistor to the active body region of the device, as used in accordance with the present invention.

Detailed embodiments and examples of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The present invention relates to semiconducting devices having a body resistor that is in electrical communication with the active body of the semiconducting device. The body resistor may be utilized to modulate current that flows through the active body of the device, which in turn produces an increase or decrease in potential that effectively alters the field effect transistor (FET) threshold voltage. As opposed to typical transistors used in SOI technology that have an effectively infinite body resistance, the device of the present invention may incorporate different resistors to set the body resistance based on circuit desires. When describing the following methods and structures, the following terms have the following meanings, unless otherwise indicated.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentrations in an extrinsic semiconductor the conductivity type of the semiconductor.

As used herein, the term "conductivity type" denotes a dopant region being p-type or n-type.

As used herein, a "p-type" refers to the addition of impurities to an intrinsic semiconductor that create deficiencies of valence electrons, such as boron, aluminum or gallium to an intrinsic Si-containing substrate.

As used herein, an "n-type" refers to the addition of impurities that contribute free electrons to an intrinsic semiconductor, such as antimony, arsenic or phosphorous to a Si-containing substrate.

A "gate structure" means a structure used to control output current (i.e. flow of carriers in the channel) of a semiconductor device through electrical or magnetic fields.

As used herein, the term "channel" is the region underlying the gate structure and between the source and drain of a metal oxide semiconductor transistor that becomes conductive when the semiconductor device is turned on.

As used herein, the term "drain" means a doped region in semiconductor device located at the end of the channel, in which carriers are flowing out of the transistor through the drain.

As used herein, the term "source" is a doped region from in the semiconductor device, in which majority carriers are flowing into the channel.

The "active body region" includes the channel, the drain, and the source of the semiconducting device.

As used herein, the terms "insulating" and "dielectric" denote a material having a room temperature conductivity of less than about $10^{-10}(\Omega\text{-m})^{-1}$.

"Electrically conductive" as used through the present disclosure means an element having a room temperature conductivity of greater than $10^{-8}(\Omega\text{-m})^{-1}$.

The term "electrical contact" denotes direct physical contact between two elements, wherein the interface between the two elements is electrically conductive.

The terms "direct physical contact" or "on" mean that the two structures are in contact without any intermediary conducting, insulating or semiconducting structures.

The term "electrically communicating" or "electrical communication" denotes an electrically conductive path between two elements wherein an intermediary conducting or semiconducting structures can be present between the two elements.

"Electrically isolated" means that there is no electrical communication between adjacent semiconductor regions.

A "body resistor" as used herein, means a resistor in electrical communication to the active body region of a semiconductor device.

The terms "overlying", "underlying", "atop", and "abutting" define a structural relationship in which two structures are in contact where an intermediary structure of a conducting, insulating, or semiconducting material may or may not be present at the interface of the two structures.

References in the specification to "one embodiment", "an embodiment", "an example", etc., indicate that the embodiment or example described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Figure 1B:
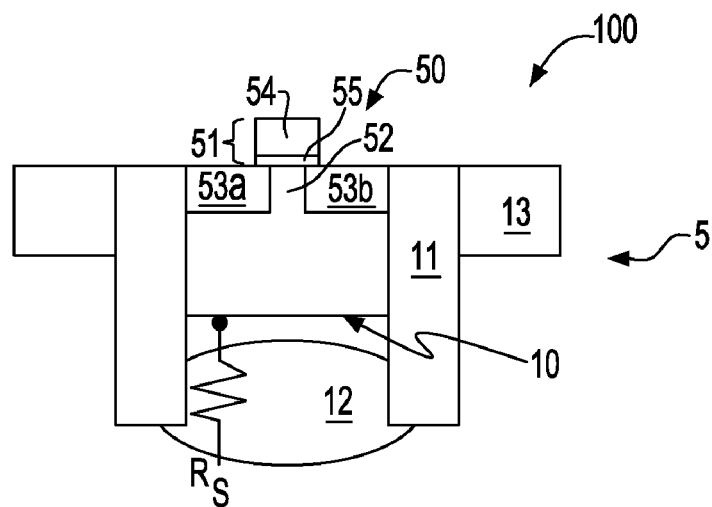
FIG. 1(b) is a side cross-sectional view along section line A-A of FIG. 1(a), in accordance with the present invention.
Figure 1C:
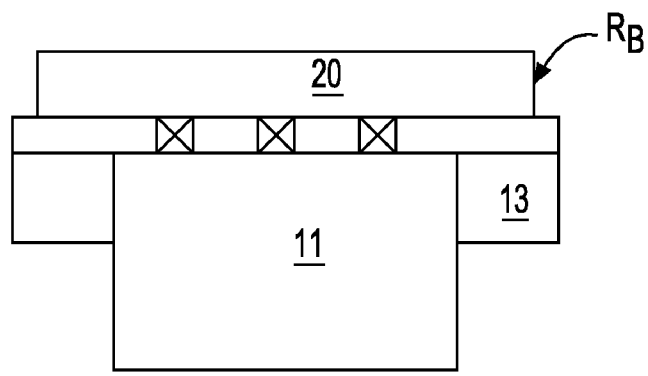
FIG. 1(c) is a side cross-sectional view along section line B-B or FIG. 1(a), in accordance with the present invention.
Figure 2:
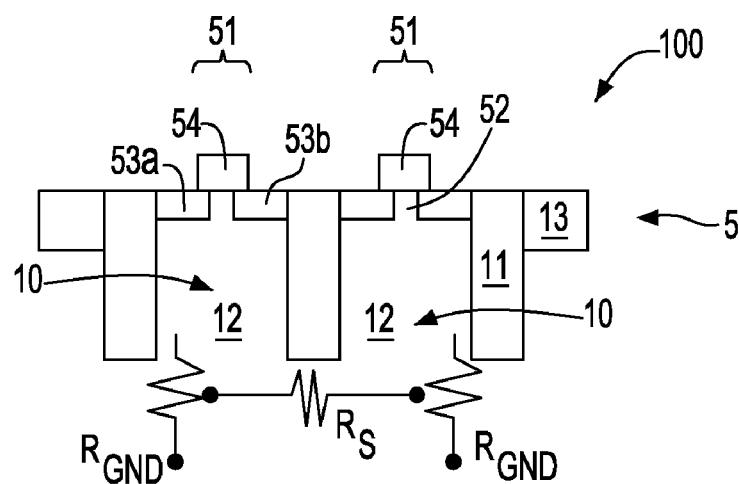
FIG. 2 is a side cross sectional view of a semiconducting device depicting the potential electrical pathways through the substrate, such as the resistance of the substrate and the resistance of the ground.

FIGS. 1(A)-1(C) depict one embodiment of a semiconducting device 100 having a bulk semiconductor substrate 5, in which an effect similar to the floating body effect, which is typical in SOI substrate devices, is produced and is utilized to increase the switching speed of the device, and is utilized for delay control in the switching of the device. In one example, the floating body effect that is produced by the present invention may result from a body resistance ($R_b$) that is created in the active body region 10 (also referred to as "isolated active body region") of the semiconducting device 100. The amount of floating body effect can be tuned using different body resistances ($R_b$).

FIG. 1(A) depicts a semiconducting device 100, in which the body resistance is provided by a body resistor $R_B$ that is in electrical communication with the active body region 10. The semiconductor device 100 may include a bulk semiconductor substrate 5 having at least one field effect transistor 50 formed thereon. The field effect transistor 50 includes at least one isolated active body region 10 and a body resistor $R_B$ that is in electrical communication with the isolated active body region 10.

The bulk semiconductor substrate 5 may comprise one of Si, Ge alloys, SiGe, GaAs, InAs, InP, SiCGe, SiC as well as other III/V or II/VI compound semiconductors. In addition to the above, the bulk semiconductor substrate 5 may be composed of any Si-containing semiconductor.

The field effect transistor 50 includes a gate structure 51 overlying a channel 52, wherein the channel 52 is positioned between a source region 53a and a drain region 53b. The gate structure 51 may include a gate conductor 54 positioned atop a gate dielectric 55, wherein the gate dielectric 55 is present on the bulk semiconductor substrate 5 overlying the channel 52.

The gate dielectric 55 may be a low-k dielectric material (having a dielectric constant equal to or less than 4.0), such as $SiO_2$, or a high-k dielectric (having a dielectric constant greater than about 4.0), such as oxides of Ta, Zr, Al or combinations thereof. Hf containing high-k dielectrics have also been contemplated and are within the scope of the present invention. The gate dielectric 55 has a thickness of from about 1 nm to about 10 nm.

The gate conductor 54 may be composed of polysilicon, such as doped polysilicon. In another embodiment, the gate conductor 54 may be composed of a conductor selected from the group including, but not limited to: elemental metals, metal alloys, or metal silicides. The gate conductor 54 may have a thickness ranging from about 10 nm to about 100 nm.

In one embodiment, the gate structure 51 is formed utilizing deposition, photolithography and etching. More specifically, material layers for the gate dielectric 55 and the gate conductor 54 are formed atop the bulk substrate 5 using a deposition process, such as chemical vapor deposition or sputtering. A pattern is then produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected, while the exposed regions are removed using a selective etching process that removes the unprotected regions, wherein the remaining material layers provide the gate structure 51. In one embodiment and when viewed from a top down planar view, the gate structure 51 has a T-shaped configuration.

The field effect transistor 50 may include n-type or p-type doped source and drain regions 53a, 53b. The source and drain regions 53a, 53b may be formed via ion implantation and activation annealing, and may be present in the portion of the bulk semiconductor substrate 5 that is adjacent to the portion of the substrate that is underlying the gate structure 51, which is referred to as the channel 52. P-type doped source and drain regions 53a, 53b are typically produced with group III-A elements. N-type doped source and drain regions 53a, 53b are typically produced with group V elements. The source region and drain regions 53a, 53b may include extension regions (not shown) and deep source and drain regions. One or more spacers (not shown) may be present abutting the gate structure 51. The spacers may be composed of a dielectric material, including but not limited to oxide and nitrides, wherein the width and number of spacers is selected to correspond with the selected dopant. Halo implant regions may also be present.

Referring to FIGS. 1A and 1B, the field effect transistor 50 includes an isolated active body region 10. The isolated active body region 10 includes the channel 52 and the source and drain regions 53a, 53b for a single field effect transistor 50. Isolated denotes that the active body region 10 of the field effect transistor 50 is at least electrically isolated from the active body region of an adjacent field effect transistors. In one embodiment, electrical isolation is provided by an insulating trench, such as a deep trench isolation region 11 positioned between the active body regions of the adjacent active body regions. The insulating trench when having a depth ranging from about 300 nm to about 1000 nm may be referred to as a deep trench isolation region 11.

In this embodiment, the active body region 10 of a first field effect transistor 50 is in direct physical contact with a first end of the deep trench isolation region 11, wherein the active body region 10 of the adjacent field effect transistor is in direct physical contact with an opposing end of the insulating trench. The only electrical connection between bodies of adjacent FETS occurs beneath the deep trench isolation regions 11. In one embodiment, it is important that the resistance of the substrate $R_S$ is large compared to the body resistor $R_B$ so that the body resistor $R_B$ dominates the electrical behavior of the device.

The isolated active body region 10 of the field effect transistor 50 may also be further isolated by enclosing the active body region 10 in a well region 12 of opposite conductivity. For example, when the active body region 10 with a p-type dopant, the well region 12 is doped with an n-type dopant. The p-type dopant of the active body region 10 may be present in a concentration ranging from about $1\times10^{15}$ to about $1\times10^{17}$, wherein the n-type dopant of the well 12 may be present in a concentration ranging from about $1\times10^{16}$ atoms/cm$^3$ to about $1\times10^{18}$ atoms/cm$^3$. In another example, when the active body region 10 are doped with an n-type dopant, the well region 12 is doped with a p-type dopant. The n-type dopant of the active body region 10 may be present in a concentration ranging from about $1\times10^{15}$ atoms/cm$^3$ to about $1\times10^{17}$ atoms/cm$^3$, wherein the p-type dopant of the well region 12 may be present in a concentration ranging from about $1\times10^{16}$ atoms/cm$^3$ to about $1\times10^{18}$ atoms/cm$^3$.

Referring to FIGS. 1A and 1C, the body resistor ($R_B$) may be a polysilicon resistor 20. Briefly, to produce polysilicon resistors for integrated circuits, polysilicon is deposited on the bulk semiconductor substrate 5 surface and doped via ion implantation. The polysilicon may then be patterned using a photoresist etch mask and then etched to define the shape of the body resistor ($R_B$). In one embodiment, the polysilicon is etched using reactive ion etch.

Typically, the resistance of a polysilicon resistor 20 may range from about 200Ω to about 4000Ω. In one embodiment, the cross sectional area of the polysilicon resistor 20 ranges from about 2000 nm to about 8000 nm$^2$, and the polysilicon resistor 20 is doped with boron to a concentration ranging from about $1\times10^{19}$ atoms/cm$^3$ to about $1\times10^{20}$ atoms/cm$^3$, the resistance of the polysilicon resistor 20 may be as specified above.

Referring to FIGS. 1A and 1C, the polysilicon resistor 20 may be formed atop the bulk Si substrate and may be in electrical contact to the upper surface of the isolated active body region 10 of the device. It is not required that there be a direct physical contact, so long as the polysilicon resistor 20 is in electrical communication to the isolated active body region 10 of the field effect transistor 50. A polysilicon resistor 20 having geometry in which the length and/or width of the polysilicon resistor 20 is greater than the depth of the polysilicon resistor 20 may be referred to as a planar polysilicon resistor. It is noted that any geometry may be selected for the planar polysilicon resistor so long as the polysilicon resistor 20 is in electrical communication with an isolated active body region 10 of a field effect transistor 50.

In another embodiment, the polysilicon resistor 20 may be formed into the bulk semiconductor substrate 5 and extend below the upper surface of the bulk semiconductor substrate 5. Prior to depositing the polysilicon, a portion of the bulk semiconductor substrate 5 may be etched to provide a trench. The depth of the trench is selected to provide electrical communication between the subsequently formed polysilicon resistor 20 and the isolated active device region 10 of the field effect transistor 50. The electric communication may be provided by electrical contact between the polysilicon resistor 20 and the isolated active device region 10. Following the formation of the trench, a deposition process, such as chemical vapor deposition or epitaxial growth, fills the trench with polysilicon. The polysilicon is then doped to provide a polysilicon resistor 20. The dopant may be boron, which may be present in the polysilicon resistor 20 in a concentration ranging from about $1\times10^{19}$ atoms/cm$^3$ to about $1\times10^{20}$ atoms/cm$^3$, in order to produce a resistance from about 200 ohms to 4000 ohms. A polysilicon resistor 20 having a depth that is greater than its width or length may be referred to as a vertical polysilicon resistor.

Any other element capable of resisting the flow of electricity may be used for the body resistor $R_B$. In a further embodiment, the resistance of a transistor may serve the function of resistor 20, wherein the channel 52 of the field effect transistor 50 provides body resistor $R_B$. When utilizing the bulk semiconductor substrate 5 of the field effect transistor 50 as the body resistor $R_B$, the resistor may be referred to as a metal oxide semiconductor field effect transistor (MOSFET) resistor. The effective resistance of the MOSFET resistor may be modified by varying the potential on its gate, such that its resistance may range from near zero to near infinity.

Referring to FIGS. 1A-1C and FIG. 2, electrical isolation of the active body region 10 in the bulk semiconductor substrate 5 may be provided by a substrate resistance $R_S$ and a ground resistance $R_{GND}$ that is greater than the resistance of the body resistor $R_B$. In the case where a region of opposite dopant 12 is interposed between the transistor body and the substrate, the effective resistance $R_s$ is very large, i.e., typically on the order of approximately one mega-ohm or greater.

Figure 3:
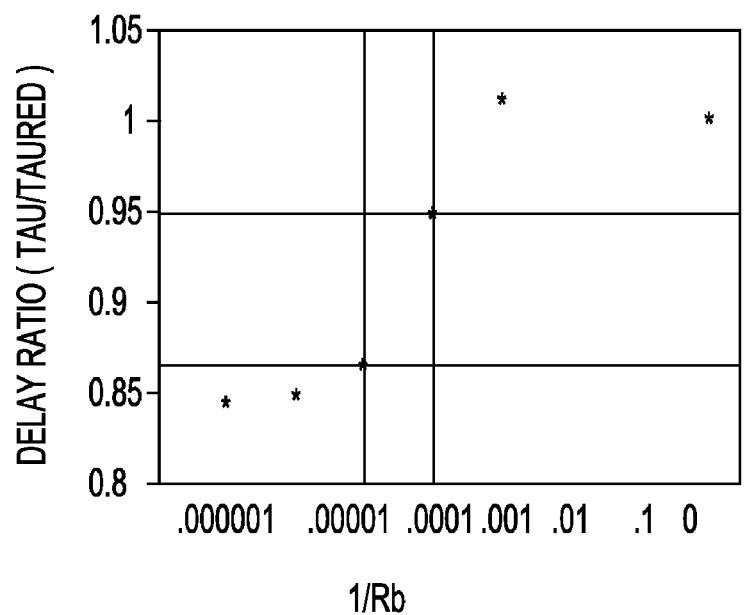
FIG. 3 depicts a plot of delay ratio v. body resistance ($R_b$) for one example of a device that has been formed in accordance with the present invention.

By providing a body resistor $R_B$ having a lower resistance to the active body region 10 then the substrate resistance $R_S$ and the ground resistance $R_{GND}$ of the device, the rise and fall of the rectangular waveform of the semiconductor devices may be modulated. More specifically, the present invention can produce a floating body effect through a resistance at the active body region 10 of the device. The amount of floating body effect can be tuned through adjustment of the body resistor $R_B$. The body resistor $R_B$ also allows for a reduction in the delay of the circuit. FIG. 3 depicts a plot of $1/R_B$ versus delay ratio for a semiconductor device formed in accordance with the present invention. The vertical axis is the ratio of the delay for the circuit with a given body resistance $R_B$ in accordance with the present invention, normalized to the delay without a body resistor, as in the prior art. As depicted in FIG. 3, as the body resistor ($R_B$) increases as the delay ratio decreases, indicating faster circuit operation.

Figure 4:
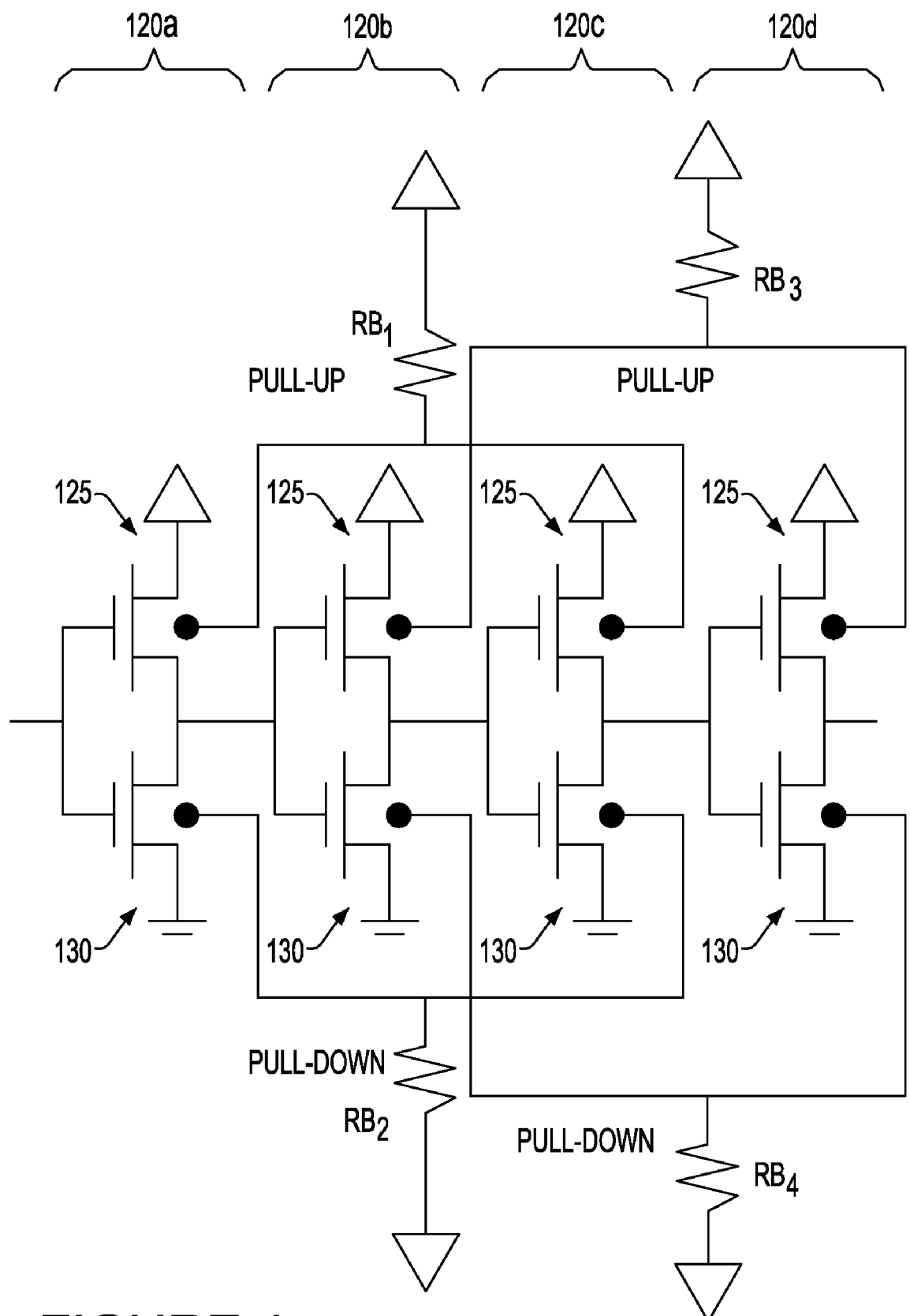
FIG. 4 is a circuit diagram of one embodiment of a device including four inverters each including a pull up transistor and a pull down transistor, in accordance with the present invention.

FIG. 4 depicts a circuit diagram for a device including four inverters 120a, 120b, 120c, 120d, each including a pull up transistor 125 and a pull down transistor 130. A first body resistor $R_{B1}$ is in electrical communication to the isolated active body of the pull up transistors 125 of the first inverter 120a and the third inverter 120c. A second body resistor $R_{B2}$ is in electrical communication to the isolated active body of the pull down transistor 130 of the first inverter 120a and the third inverter 120c. A third body resistor $R_{B3}$ is in electrical communication to the isolated active body of the pull up transistor 125 of the second inverter 120b and the fourth inverter 120c. A fourth body resistor $R_{B4}$ is in electrical communication to the isolated active body of the pull down transistor 130 of the second inverter 120b and the fourth inverter 120c.

As opposed to prior devices, which require separate voltages (VDD) to control the body potential of each device, the present invention utilizes a single voltage (VDD), wherein the resistance of the body resistor ($R_B$) may modulate the body potential of each device. In the embodiment depicted in FIG. 4, four resistors $R_{B1}$, $R_{B2}$, $R_{B3}$, $R_{B4}$ modulate six devices using a single voltage (VDD).

Further, the localized body potential of the MOSFET at each stage of the waveform allows the body potentials to be changed through each transition. The electrical effect of the present invention may best be understood with reference to the extreme case of infinite resistance, as would be present in an SOI configuration. The floating-body phenomenon is described in "Competitive advantage of SOI from dynamic threshold shifts and reduced capacitance" by M. Ketchen, in Proceedings of 2003 International Symposium on VLSI Technology, Systems, and Applications, pp. 129-132. The current invention allows a continuously variable body impedance to modulate the degree of floating-body effect observed.

Using the above described structures and phenomena, a method of controlling bias in an electrical device is provided. In an initial step, semiconductor devices 100 are provided on a bulk semiconductor substrate 5, wherein each of the semiconductor devices 100 comprise an active body region 10 that is isolated from the active body region of adjacent devices. A body resistor $R_B$ is then provided in electrical contact with the active body region 10 of the bulk semiconductor substrate 5, wherein the body resistor $R_B$ provides for adjustability of the body potential of the semiconductor devices.

While the present invention has been particularly shown and described with respect to the preferred embodiments thereof, it will be understood by those skilled in the art that the foregoing and other changes in forms of details may be made without departing form the spirit and scope of the present invention. It is therefore intended that the present invention not be limited to the exact forms and details described and illustrated, but fall within the scope of the appended claims.

What is claimed is:

1. A method of controlling body potential in an electrical device comprising:
   providing a plurality of semiconductor devices on a bulk semiconductor substrate, wherein each of the semiconductor devices comprises an active body region that is isolated from an active body region of adjacent semiconductor devices;
   providing a body resistor in electrical communication to each active body region of the bulk semiconductor substrate; and
   modulating current through the active body region of each semiconductor device of the plurality of semiconductor devices with the body resistor to independently alter the threshold voltage of each semiconductor device of the plurality of semiconductor devices to increase or decrease the switching speed to each semiconductor device.

2. The method of claim 1, wherein the active body region of each semiconductor device is isolated from the active body region of the adjacent semiconductor devices by a trench isolation region separating the active body regions of the adjacent semiconductor devices.

3. The method of claim 1, wherein the active body region of each semiconductor device is isolated from the active body region of the adjacent semiconductor devices by electrical isolation provided by a substrate resistance and a ground resistance being greater than a resistance of the body resistor.

4. The method of claim 3, wherein the semiconductor devices include a pull up transistor and a pull down transistor.

5. The method of claim 4, wherein the pull up transistor comprises a first conductivity and the pull down transistor comprises a second conductivity.

6. The method of claim 5, wherein the first conductivity comprises a p-type field effect transistor, and the second conductivity comprises an n-type field effect transistor.

7. The method of claim 6, wherein electrical isolation of the p-type field effect transistor is provided in the active body region by enclosing the p-type field effect transistor body in at least one p-type well, and electrical isolation of the n-type field effect transistor is provided in the active body by enclosing the n-type field effect transistor body in at least one n-type well.

\* \* \* \* \*